United States Patent [19]

Watari et al.

[11] 3,807,038

[45] Apr. 30, 1974

[54] PROCESS OF PRODUCING SEMICONDUCTOR DEVICES

[75] Inventors: Yoshihiko Watari; Isao Inoue; Yuji Kusano, all of Itami, Japan

[73] Assignee: Mitsubishi Denki Kabushiki Kaisha, Tokyo, Japan

[22] Filed: May 11, 1972

[21] Appl. No.: 252,493

Related U.S. Application Data

[63] Continuation of Ser. No. 38,121, May 18, 1970, abandoned.

[30] Foreign Application Priority Data

May 22, 1969 Japan ............................... 44-39738

[52] U.S. Cl. ....................... 29/578, 29/580, 156/17, 148/187

[51] Int. Cl. ............................................ B01j 17/00

[58] Field of Search ................ 29/578, 580; 156/17; 148/187

[56] References Cited

UNITED STATES PATENTS

| | | | |
|---|---|---|---|
| 3,542,551 | 11/1970 | Rice | 29/578 |
| 3,438,873 | 4/1969 | Schmidt | 29/578 |
| 3,479,237 | 11/1969 | Bergh et al. | 156/11 |

*Primary Examiner*—W. C. Tupman

*Attorney, Agent, or Firm*—Robert E. Burns; Emmanuel Lobato

[57] ABSTRACT

By etching away a silicon nitride coating on a semiconductor substrate by photolithographic technique, windows of a predetermined pattern are formed in the coating to serve to deposit electrodes on and diffuse active regions into the substrate. Then a silicon dioxide coating deposited on the nitride coating and within the windows and partly removed by photolithographic technique to again form the windows for diffusion followed by the diffusion of the active regions into the substrate. An etchant chiefly attacking the oxide coating is used to again make all the windows for depositing the electrodes within them on the substrate.

7 Claims, 2 Drawing Figures

PROCESS OF PRODUCING SEMICONDUCTOR DEVICES

This application is a continuation of our application, Ser. No. 38,121, Filed May 18, 1970, now abandoned.

BACKGROUND OF THE INVENTION

This invention relates to a process of producing semiconductor devices, and more particularly to improvements in a process of exactly forming minute patterns on a semiconductor substrate.

In forming a plurality of semiconductor devices on a semiconductor wafer, the photolithographic and masking techinques give rise not only to the critical problem of registering the semiconductor with a mask that is used but also the mask itself may be deformed during service. For example, even if the mask is exactly aligned with the semiconductor wafer on the central portion, it may depart from its proper position on the peripheral portion of the semiconductor wafer. Also even if a plurality of identical masks have been formed by use of the most precise technique presently available, the spacing as to the entire pattern thereon can inevitably vary by the order of 2 or 3 microns from one to another in the resulting masks. Further upon selectively etching a pair of electrically insulating layers on a semiconductor wafer it can be often required to fully etch away one of the layers while a substantial part of the other layer is left. Such selectively etching process has been previously difficult to be controlled.

SUMMARY OF THE INVENTION

Accordingly it is an object of the invention to provide a new and improved process of exactly forming a minute pattern on a semiconductor wafer in which the abovementioned disadvantages are eliminated.

It is another object of the invention to facilitate the control of an etching process whereby only a thinnest portion of an electrically insulating layer on the entire surface of a semiconductor substrate is exposed through the controlled etching of the entire surface of the substrate for the purpose of producing high frequency high power transistors and like devices.

The invention accomplishes these objects by the provision of a process of producing semiconductor devices, comprising the steps of forming on one face of a semiconductor substrate a first electrically insulating coating serving as a diffusion selecting layer, removing a predetermined portion of the first insulating coating with a first etching solution to form predetermined windows in the first coating to permit the corresponding portion of the one face of the semiconductor substrate to be exposed, forming a second electrically insulating coating onto the first insulating coating including the windows to cover the first coating, and removing that portion of the second insulating coating directly disposed above a selected window with a second etching solution to expose that portion of said semiconductor substrate directly disposed under such window, the second etching solution having an etching rate for the first insulating coating less than that for the second insulating coating. A diffusion is then made through the selected window thus opened to form a diffused region having a PN junction with the substrate. The second insulating counting over another window is then removed and electrode material is deposited through the windows to form electrodes on the diffused region and on the region underlying the other window. Since all of the windows are initially made simultaneously in the first insulating area, exact relationship of the several regions to one another is assured.

BRIEF DESCRIPTION OF THE DRAWING

The invention will become more readily apparent from the following detailed description taken in conjunction with the accompanying drawing in which.

Throughout several Figures like reference numerals designate the identical or corresponding components.

DESCRIPTION OF THE PREFERRED EMBODIMENT

While the invention is applicable to a wide variety of semiconductor devices it is most readily applied to flat package type transistors formed on a silicon substrate and will now be described in detail in terms of such transistors.

Figure 1:
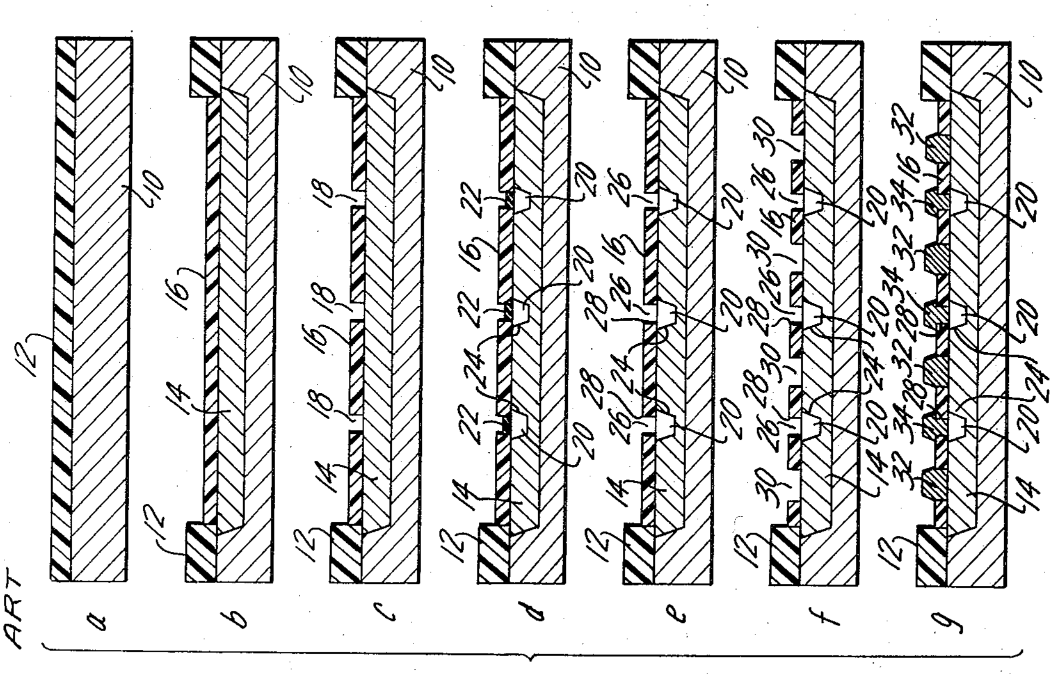
PRIOR ART FIG. 1
FIG. 1*a* through g show fragmental cross sectional views of flat package type transistors being processed in accordance with the conventional process and illustrated in the successive manufacturing steps.

Referring to the drawing and particularly to FIG. 1*a*, a substrate 10 of semiconductive silicon is shown as including an electrically insulating coating 12 deposited on one face, in this case, the upper face as viewed in FIG. 1*a*. The coating 12 is preferably of silicon dioxide ($SiO_2$) formed on the face of the silicon substrate as by thermal oxidation.

Then a predetermined portion of the silicon dioxide coating 12 is removed by any of the well known processes and a base region 14 is formed in the substrate 10 by diffusion technique. At the same time another coating 16 of silicon dioxide is formed upon the base region 14. The structure after the base region has been formed is shown in FIG. 1*b*. Then a plurality of windows 18 are formed on predetermined portions of the silicon dioxide coating 16 by any suitable means such as photolithographic technique as shown in FIG. 1*c* for diffusing emitter regions into the base region 14.

Thereafter any suitable impurity is diffused into the base region 14 through the windows 18 to form emitter regions 20 having the respective P-N junctions 24 formed therebetween with the P-N junctions including their extremities 24 reaching the interface of the base region 14 and the coatings 16 or the face of the substrate 10 as shown in FIG. 1*d*. It is noted that a coating 22 of silicon dioxide is again disposed in each of the windows 18 simultaneously with the formation of the emitter regions 20 as shown in FIG. 1*d*.

The succeeding step is to remove the silicon dioxide coatings 22 within the windows 26 by photolithographic technique. To this end, the substrate 10 can be put in any suitable etching solution of hydrofluoric acid system for a period of time sufficient to completely etch away the coatings 22 on the emitter regions 20 to provide windows 26 as shown in FIG. 1*e* for depositing emitter electrodes therein as will be described hereinafter. It will be readily understood that the removal of the coatings 22 is inevitably accompanied by the partial removal of the surfaces of the coatings 12 and 16. A side wall encircling each window 26 is formed of an edge face 28 of the coating 16 disposed upon the associated emitter region 20 to cover the extremity 24 of the P-N junction between the emitter and common base regions.

Then windows 30 are formed in predetermined portions of the coating 16 on the base region 14 in a similar manner as above described in conjunction with the windows 26 for depositing base electrodes therein (see FIG. 1*f*).

Thereafter base and emitter electrodes 32 and 34 are deposited in the windows 30 and 26 respectively as by evaporation technique to be put in ohmic contact with the base and emitter regions 14 and 20 respectively whereupon flat package type transistors have been produced on the substrate 10 as shown in FIG. 1*g*.

According to the conventional process as above described, the silicon dioxide coatings 22 are required to be completely removed upon forming the emitter windows 26 while at the same time they are required not to be excessively removed. Particularly for transistors required to include the extremely shallow diffusion junction therein for the purpose of improving the high frequency characteristics, the extremity 24 of the P-N junction reaching the surface of the semiconductor substrate 10 is usually spaced away from the associated edge face 28 of the silicon dioxide coating 16 positioned upon the emitter region 20 and covering that junction extremity 24, by a distance equal to about 70 percent of the diffusion depth. For example, if the emitter region 20 is diffused into the base region 14 to a depth equal to or less than one micron then the distance just described will become as very short as from 0.6 to 0.7 micron. Therefore if it is attempted to completely remove the silicon dioxide coatings 22 such removal may be excessively effected so that the extremity 24 of the P-N junction will be exposed. Therefore the removal of the insulating coatings 22 has been extremely difficult to be controlled with the result that the yield rate has inevitably decreased.

Further the conventional process as above described has been disadvantageous in that due to the use of a mask or masks, it is very difficult to form the base windows 11 at their predetermined correct positions over the entire face of the semiconductor substrate. More specifically, any mask used with photolithographic technique is essential to include a multiplicity of patterns identical to one another and disposed at the substantially same intervals in rows and columns thereon. Actually, however, even if a plurality of identical masks have been formed by means of the best existing techniques, the spacing as to the entire pattern may vary by an amount of from 2 to 3 microns from one to another of the resulting masks. In addition, it is very difficult in mass production to effect the correct registration of the mask whereby the entire mask is disposed at its proper position on the associated semiconductor wafer or substrate. For example, even if one of the base windows 30 has been formed at its desired position on the central portion of the semiconductor substrate 10, the peripheral portion of the substrate may have such windows formed at positions deviating from their desired positions. The smaller the size of the patterns the more serious the disadvantages will be.

The invention contemplates wholly eliminating the two disadvantages as above described that could not previously be avoided.

The invention contemplates also to facilitate the control of an etching process by which the entire surface of semiconductor substrate is selectively etched to expose only the thinnest portion of an oxide film thereon as in manufacturing high frequency, high power transistors.

Briefly, the invention comprises removing a first electrically insulating coating disposed on a semiconductor substrate and a second electrically insulating coating disposed upon the first insulating layer through the use of two types of etching solution, namely a first etching solution principally attacking the first insulating coating and a second etching solution principally attacking the second insulating coating and having such a behavior that it etches the first insulating coating at a much lower rate than the rate at which the same solution etches the second insulating coating. This measure permits a predetermined portion or portions of the second insulating coating to be etched away without the first insulating coating etched away.

Figure 2:
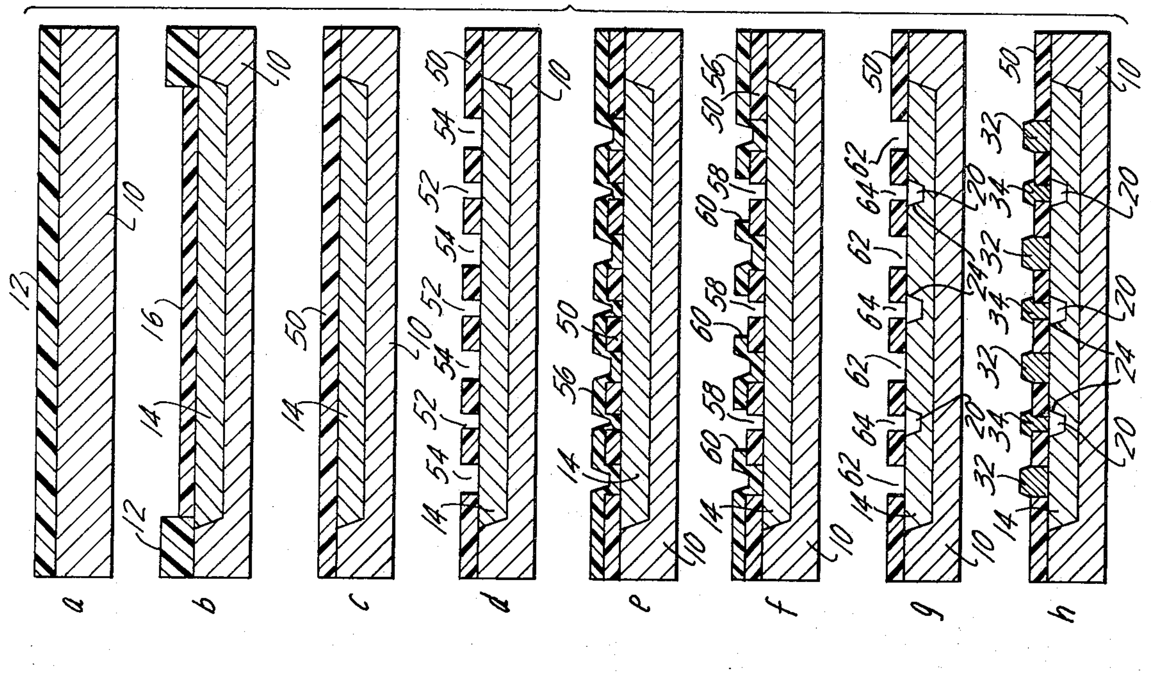
FIG. 2*a* through *h* are views similar to FIG. 1 but illustrating by way of example one embodiment of the invention.

FIG. 2 shows flat package type transistors being processed in accordance with the process of the invention. As shown in FIG. 2*a*, a substrate 10 of semiconductive silicon has disposed on one face shown as the upper face thereof a coating 12 of oxide such as silicon dioxide. Then a predetermined portion of the oxide coating 12 is removed as by the photolithographic technique after which a base region 14 is diffused into the upper face of the substrate 10 with an insulating coating 16 of silicon dioxide simultaneously disposed on the upper face as shown in FIG. 2*b*. The steps illustrated in FIGS. 2*a* and *b* are identical to those shown in FIGS. 1*a* and *b*.

According to the principles of the invention, the oxide coatings 12 and 16 are entirely removed by any suitable means and a first insulating coating 50 preferably formed of silicon nitride is deposited on the entire upper face of the stubstrate 10 in the well known manner as shown in FIG. 2*c*.

If that insulating coating is directly put in contact with the semiconductor substrate 10 to modify the electric characteristics of the finished device it is not required to remove completely the coatings 12 and 14. Alternatively, after those coatings have been completely removed another coating of any suitable insulating material (not shown) may be deposited on the substrate to an appropriate thickness and then the silicon nitride coating 50 is deposited upon such other coating.

Then a mask (not shown) bearing thereon patterns defining the positions and configurations of emitter regions and base electrodes to be disposed on the substrate is properly superposed on the substrate 10 and hot phosphoric acid is used to etch away the coating 50 by photolithographic technique to form windows therein. Those windows designated by the reference numeral 52 serves to diffuse the emitter regions into the base region while those windows designated by the reference numeral 54 serves to deposit base electrodes on the substrate. FIG. 2*d* shows the arrangement just described. It has been found that hot phosphoric acid is preferably used to etch away the nitride coating 50.

Then a second insulating coating 56 preferably formed of silicon dioxide is deposited both upon the first insulating coating 50 and within the windows 52 and 54 as shown in FIG. 2*e*.

FIG. 2*f* shows an arrangement after the second insulating coating 56 has been partly etched away by photolithographic technique to again form emitter windows 58 on the base region 14 of the substrate. It has been found that an etching solution of hydrofluoric acid system is preferably used to partly etch away the second insulating coating 56 of silicon dioxide. Such an etching solution has the property that it chemically attacks the first insulating coating 50 of silicon dioxide. In FIG. 2*f* it is noted that the emitter windows 52 shown in FIG. 2*d* fully appear in the coatings 50 and 56 with the configuration and dimension thereof substantially not changed from that of the windows 52 as shown in FIG. 2*d*, while the base windows 54 remain covered with the coating 56. In FIG. 2*f* the emitter windows are designated by the reference numeral 58. As shown in FIG. 2*f*, the emitter windows 58 are encircled by the first insulating coating 50 and communicate with different ones of openings or windows 60 disposed above the same and encircled by the second insulating coating 56. The windows 58 and the window 60 are simultaneously formed and the latter windows 60 are shown in FIG. 2*f* as somewhat radially extending over the surfaces of the adjacent portions of the coating 56. This is because that portion deposited on the first insulating coating 50 of the second coating 56 has been partly etched away due to erroneous registering of the mask involved.

Any suitable impurity can now be diffused into the exposed surface portions of the base region 13 through the windows 58 and 60 to provide emitter regions 20 with P-N junctions formed therebetween. As previously described, the emitter regions 20 have the respective coatings of silicon dioxide inevitably deposited thereon simultaneously with the formation of the emitter regions although such coatings are not illustrated.

The succeeding step is to etch away both the silicon dioxide coating just described upon the emitter regions 20 and the silicon dioxide coating 56 previously formed with an etching solution of hydrofluoric acid system to form base windows 62 and emitter windows 64 as shown in FIG. 2*g*. As above described, the etching solution of hydrofluoric acid system chemically attacks the first insulating coating of silicon nitride at a very much smaller rate than the rate at which it chemically attacks the silicon dioxide coating. Therefore the silicon nitride coating 50 as shown in FIG. 2*g* remains unchanged from that illustrated in FIG. 2*d*. In other words, the windows 62 and 64 are substantially identical in configuration, dimension and position to the windows 52 and 54 as shown in FIG. 2*d*.

While FIG. 2*g* shows an arrangement after the second insulating coating 56 of silicon dioxide has been entirely removed, it is to be understood that that portion deposited on the first insulating coating 50 of the coating 56 may be left on the coating 50, if desired.

By depositing base and emitter electrodes 32 and 34 in the windows 62 and 64 respectively in the well known manner, an arrangement as shown in FIG. 2*h* is produced providing the desired transistor device.

According to the process of the invention as above described in conjunction with FIG. 2, the coating of silicon dioxide inevitably formed on the emitter regions 20 upon diffusing the emitter regions 20 is fully etched away while the first insulating coating of silicon nitride defining the emitter windows is substantially prevented from being etched away. This is attributed to the use of an etching solution of hydrofluoric acid system having the property as above described. Therefore where the emitter regions have a depth of diffusion oa shallow as 1 micron or less so that the extremity 24 of each of the emitter junctions is extremely close to the edge face of that nitride coating 14 portion positioned in the associated emitter region to cover that extremity, the second insulating coating 56 of silicon dioxide can be fully removed to form the emitter windows 64 without the extremity 24 of the P-N junction being exposed. As a result, the emitter electrodes can be disposed in good ohmic contact with the associated emitter region 20 resulting in a great increase in yield rate.

From the description for FIGS. 2*f* and *g* it will be appreciated that the base and emitter windows 62 and 62 respectively are the exact replicas of those preliminarily defined by the first insulating coating of silicon nitride with respect to the position, configuration and dimension. This results in the elimination of the disadvantages of the prior art practice caused by difference in spacing relating to the patterns in the masks and erroneous registering of the mask previously not avoidable. Therefore the extremity of the P-N junction is effectively prevented from being exposed upon selectively etching away the associated insulating coating.

While the invention has been described with a certain degree of particularity, it is to be understood that various changes and modifications may be resorted to without departing from the spirit and scope of the invention. For example, the invention is equally applicable to substrates of semiconductive materials other than silicon and also to a variety of semiconductor devices including integrated circuitries and the like. The first insulating coating may be of any suitable electrically insulating material other than silicon nitride. This is true in the case of the second electrically insulating material. Also the first and second solutions may be different from those previously specified to suit the requirements.

What is claimed is:

1. A process of producing semiconductor devices, comprising the steps of forming on one face of a semiconductor substrate a first electrically insulating coating of selected insulating material serving as a diffusing selecting layer, removing predetermined portions of said first insulating coating with a first etching solution to form predetermined windows simultaneously in the said first coating to permit the corresponding portions of the one face of said semiconductor substrate to be exposed, forming a second electrically insulating coating of different insulating material onto said first insulating coating including said windows to cover said first coating, removing that portion of said second insulating coating directly disposed above at least one selected window but fewer than all said windows with a second etching solution different from said first etching solution and having an etching rate for said first insulating coating less than that for said second insulating coating to remove said second insulating coating from said selected window without removing the first insulating coating defining said selected window thereby exposing that portion of said semiconductor substrate disposed directly under said selected window while leaving said second coating over another of said windows, diffusing material through said selected window into said substrate to form a diffused region having a PN junction with said substrate, removing said second coating overlying said other window and depositing electrode material through said selected window and said other window to form electrodes on said diffused region underlying said selected window and a region underlying said other window respectively.

2. A process according to claim 1, in which said first coating is of silicon nitride and said second coating is of silicon dioxide.

3. A process according to claim 2, in which an intermediate layer of insulating material is deposited on the substrate before applying said silicon nitride coating.

4. A process according to claim 2, in which said first etching solution is hot phosphoric acid.

5. A process according to claim 2, in which said second etching solution is hydrofluoric acid.

6. A process according to claim 1, in which prior to forming said first insulating coating on the substrate, a preliminary insulating coating is applied to said substrate, a predetermined portion of said preliminary coating is removed, a base region is diffused into the substrate where said preliminary coating has been removed and the remainder of said preliminary coating is then removed.

7. A process according to claim 1, in which said substrate is formed of silicon.

* * * * *